United States Patent
Trifonov et al.

(10) Patent No.: US 7,495,589 B1
(45) Date of Patent: Feb. 24, 2009

(54) CIRCUIT AND METHOD FOR GAIN ERROR CORRECTION IN ADC

(75) Inventors: Dimitar T. Trifonov, Vail, AZ (US);
Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/901,355

(22) Filed: Sep. 17, 2007

(51) Int. Cl.
*H03M 1/06* (2006.01)
(52) U.S. Cl. .................. 341/118; 341/120; 341/155
(58) Field of Classification Search .......... 341/118, 341/120, 155, 153, 139
See application file for complete search history.

(56) References Cited

U.S. PATENT DOCUMENTS

| | | | | |
|---|---|---|---|---|
| 6,037,886 | A * | 3/2000 | Staszewski et al. | 341/139 |
| 6,637,886 | B2 * | 10/2003 | Ushiyama et al. | 353/20 |
| 6,944,219 | B2 * | 9/2005 | Mathe | 375/232 |
| 2004/0233086 | A1 * | 11/2004 | Kiss et al. | 341/143 |

* cited by examiner

*Primary Examiner*—Peguy JeanPierre
(74) *Attorney, Agent, or Firm*—Wade J. Brady, III; Frederick J. Telecky, Jr.; Tum Thach (57) ABSTRACT

Gain errors are corrected in an ADC chip including an integrator (17), a comparator (30), and a digital filter (37) by storing a gain-adjusted LSB size based on measured gain error in a memory (44). The gain-adjusted LSB size is applied to the digital filter to cause gain-adjusted LSB size values to be added to or subtracted from accumulated content of the digital filter in accordance with a first or second state, respectively, of the comparator (30) during each cycle of the ADC. The final accumulated content after all required cycles of the ADC is a gain-corrected digital output signal (Dout(gain-corrected)).

21 Claims, 4 Drawing Sheets

CIRCUIT AND METHOD FOR GAIN ERROR CORRECTION IN ADC

BACKGROUND OF THE INVENTION

The present invention relates generally to integrated circuit ADCs (analog to digital converters), and particularly to ADC circuits and methods for correcting the gain of an ADC with minimum circuit complexity, a minimum amount of integrated circuit chip area, and a minimum amount of time required in addition to the basic ADC conversion time in order to accomplish the gain error correction.

Every ADC has gain error. There are two basic ways to correct the ADC gain error, namely analog correction and digital correction. One analog gain error correction technique is trimming of the reference voltage. That controls the transfer function of the converter so as to achieve whatever correction is needed for its gain. Another analog ADC gain correction technique is scaling the ratios of the sampling capacitors of the integration stage of the ADC. However, the known analog techniques for correcting ADC gain error require increased amounts of integrated circuit die area, and they typically require use of costly laser trimming techniques. Furthermore, the gain correction accuracy which can be achieved using analog ADC gain error correction techniques is less than can be achieved using digital ADC gain error correction techniques. Also, digital gain error correction techniques are easier to implement during final integrated circuit testing procedures than the analog gain error correction techniques.

Figure 1:
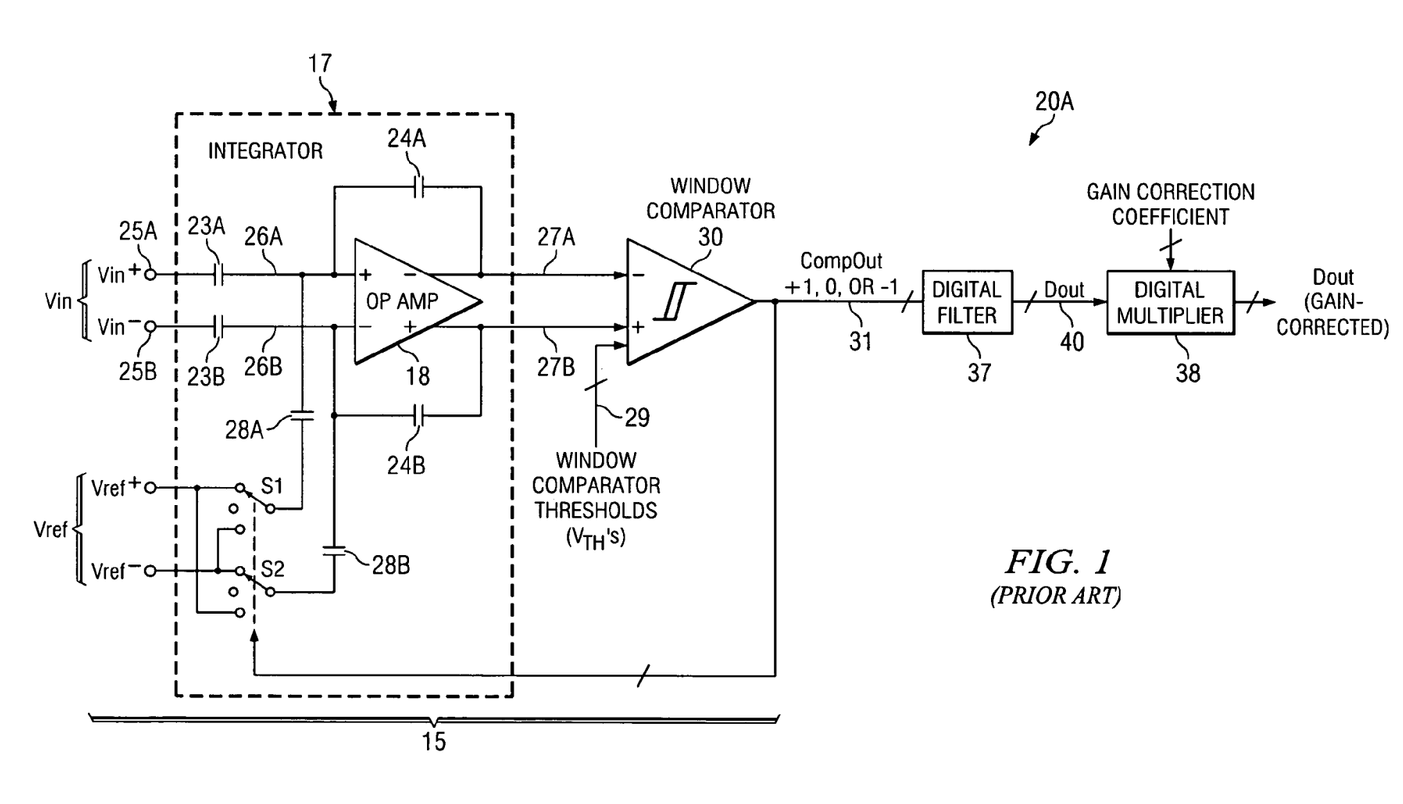
FIG. 1 is a block diagram of a conventional delta-sigma ADC including a digital multiplier for providing DC gain error correction.

Several digital methods for trimming ADC gain error have been employed. FIG. 1 illustrates a prior art delta-sigma ADC 20A which includes an integrator 17, the (−) output 27A of which is coupled to the (−) input of a window comparator 30. The (+) output 27B of integrator 17 is coupled to the (+) input of window comparator 30. Window comparator 30 may be composed of two or more conventional comparators which receive various threshold voltages $V_{TH}$ on the various conductors of window comparator threshold bus 29, respectively. An input signal voltage Vin=Vin$^+$−Vin$^-$ is coupled between plates of sampling capacitors 23A and 23B, the other plates of which are connected to the (+) and (−) inputs, respectively, of an operational amplifier 18 of integrator 17. The (+) input conductor 26A of operational amplifier 18 is coupled by an integrating capacitor 24A to the (−) output conductor 27A of operational amplifier 18, and the (−) input conductor 26B of operational amplifier 18 is coupled by an integrating capacitor 24B to the (+) output conductor 27B of operational amplifier 18. Input conductor 26A is coupled by a sampling capacitor 28A to the pole of a single pole, triple throw switch circuit S1, and input conductor 26B is coupled by a sampling capacitor 28B to the pole of a single pole, triple throw switch circuit S2. Switch circuit S1 couples the (+) input of operational amplifier 18 through sampling capacitor 28A to Vref$^+$, Vref$^-$ or an open terminal, depending upon whether the output CompOut of window comparator 30 is +1, −1, or 0, respectively, so the reference Vref can be integrated in the correct direction if necessary, depending on the decision of window comparator 30. Similarly, switch circuit S2 couples the (−) input of operational amplifier 18 through sampling capacitor 28B to Vref$^-$, Vref$^+$, or an open terminal, depending upon whether CompOut is +1, −1, or 0, respectively, so Vref can be integrated in the correct direction if necessary.

The output conductors 31 of window comparator 30 are coupled to the input of a digital filter 37, the output conductors 40 of which produce the basic un-corrected digital representation Dout of the input voltage Vin. The uncorrected signal Dout is multiplied by a digital gain correction coefficient by means of a digital multiplier 38 to produce a gain-corrected digital output signal Dout(gain-corrected).

Figure 2:
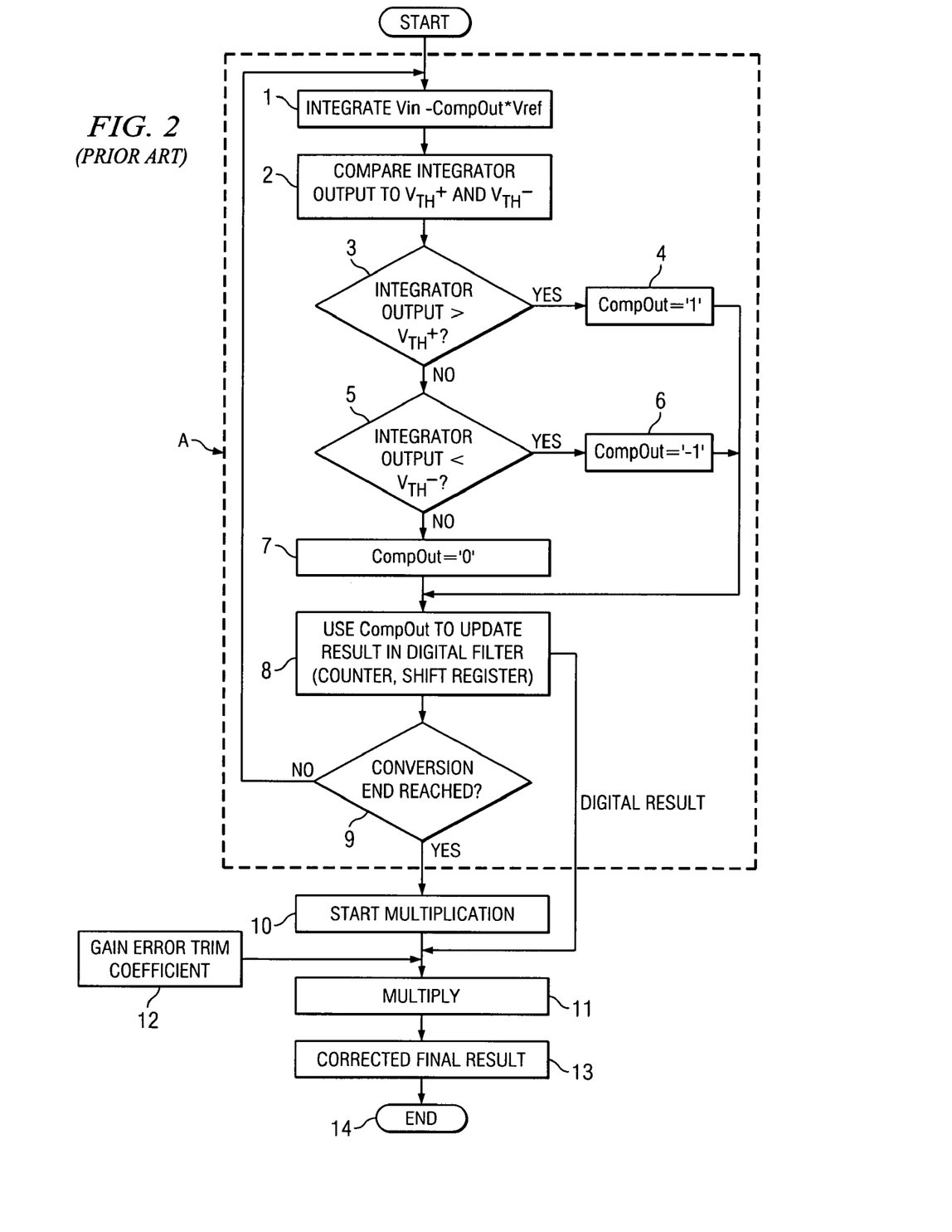
FIG. 2 is a flow chart illustrating a conventional digital ADC gain error correction technique used in the delta-sigma ADC of FIG. 1.

FIG. 2 is a flowchart which indicates the operation of ADC 20A of FIG. 1. The part of FIG. 2 within dashed line A generally indicates how the delta-sigma modulator 15 consisting of integrator 17, window comparator 30, and switch circuits S1 and S2 operate in conjunction with window comparator 30 so as to cause the accumulation of new values in digital filter 37. As indicated in block 1 of FIG. 2, integrator 17 integrates only the input voltage Vin during the first integration cycle of delta-sigma modulator 15, since initially window comparator output CompOut is 0. Then, as indicated in block 2, window comparator 30 determines whether the output of integrator 17 is greater than a threshold voltage $V_{TH}^+$, less than $V_{TH}^-$, or between them. Depending on the results of this comparison, the output of window comparator 30 is "1", "−1", or "0", respectively. The threshold voltages $V_{TH}^+$ and $V_{TH}^-$ can be derived from Vref and the scaling of various capacitors in integrator 17 so as to provide the various desired window comparator threshold voltages $V_{TH}$ (not shown) of the standard comparators of which window comparator 30 is comprised.

In any case, window comparator output CompOut is coupled into and added to the accumulated result in digital filter 37. If modulator 15 is a first order delta-sigma modulator as shown in FIG. 1, digital filter 37 can be implemented as an up-down counter, i.e., as an accumulator. For first-order delta-sigma modulator 15 as shown in FIG. 1, the up-down counter or accumulator of digital filter 37 is incremented by 1 if the output of window comparator 30 is +1 as indicated in decision block 3 and block 4, is decremented by 1 if the output of window comparator 30 is −1 as indicated in decision block 5 and block 6, or remains unchanged if the output of window comparator 30 is "0" as indicated in block 7 of FIG. 2.

Then, as indicated in decision block 9, the process being performed in ADC 20A determines if all of the integration cycles required by ADC 20A have been performed. If this determination is negative, the integrate and compare loop including blocks 1-9 is repeated as needed to complete the basic analog-to-digital conversion. On the second and each following required integration cycle after the second, integrator 17 samples not only the input voltage Vin, but also samples the reference voltage value Vref$^+$ or Vref$^-$ in accordance with window comparator output CompOut. In the case wherein CompOut is too high, i.e., the input to window comparator 30 is greater than the upper threshold voltage Vref$^-$, window comparator 30 makes a decision to generate a +1 output level, and during the next integration cycle integrator 17 samples the lower reference voltage value $V_{TH}^-$ in addition to sampling the input voltage Vin, and this causes the output of integrator 17 to decrease. Similarly, in the case wherein CompOut is too low, i.e., the input to window comparator 30 is less than the lower threshold voltage $V_{TH}^-$, window comparator 30 makes a decision to generate a −1 output level, and during the next integration cycle integrator 17 samples the upper reference voltage value $V_{Ref}^+$ in addition to sampling the input voltage Vin, and this causes the output of integrator 17 to increase.

After the process of sampling Vin and Vref the required numbers of times, the determination of decision block 9 eventually is affirmative. The window comparator output CompOut then is coupled for the last time into digital filter 37, which then produces the uncorrected digital output Dout on bus 40, and the basic analog-to-digital conversion is complete.

After the basic conversion of Vin to the uncorrected digital output signal Dout on bus 40 has been completed, it is multiplied by a gain error trim coefficient to produce the corrected final digital output Dout(gain-corrected) of ADC 20A, as indicated in blocks 11, 12, and 13 in the flow chart of FIG. 2.

As an example, assume that an input voltage Vin of 1.0 volt and a reference voltage Vref are applied to ADC 20A of FIG. 1. Assume also that the analog-to-digital conversion of the applied 1.0 volt input signal is performed, and the result is not the desired 1.0 volt digital output voltage value, but instead is a 0.9 volt digital output voltage value because of gain error of ADC 20A. One way to correct the gain error in the digital domain is to determine the value of a digital gain correction coefficient, which in this simplified example is approximately 1.1, and store it in the ADC integrated circuit die. Then the digital output conversion value of 0.9 volt produced by digital filter 37 on bus 40 is automatically multiplied by the stored digital gain error trim coefficient of approximately 1.1. In this example of Vin being equal to 1.0 volt, the multiplication result is a corrected output value of Dout very close to 1 volt (actually, 0.99 volts). From then on, every time an analog to digital conversion of Vin is performed, the resulting digital output Dout on bus 40 is multiplied by the digital gain error trim coefficient 1.1 (in this simplified example) to thereby obtain a corrected digital output voltage Dout(gain-corrected).

A problem with the above described prior art technique is that implementing a digital multiplier is always expensive because it requires complex circuitry and a large amount of integrated circuit die area, and also because it requires a large amount of quiescent current and hence a large amount of power dissipation. The above described prior art technique also is very time-consuming, because the analog-to-digital conversion must be performed first, and then the slow digital multiplication of the ADC conversion result must be multiplied, bit by bit, by the digital error correction coefficient, which adds a substantial amount to the time required for the basic ADC conversion process in order to obtain a gain-error-corrected digital output value Dout(gain-corrected) which accurately represents Vin. An additional drawback of this digital multiplication process is the possibility that the ADC transfer function may have missing codes, due to round-off errors.

Another known digital technique for trimming ADC gain error is by changing the number of integration cycles in a first order delta sigma ADC. This method does not provide adequate trim resolution if the number of integration cycles is too low. (A 0.1% resolution change is often considered sufficient to be an acceptable increase in resolution order to achieve an acceptable ADC gain error correction.) In some ADC architectures, the number of integration cycles can be very low, so the resolution of the digital gain error correction is poor if the method of changing the number of integration cycles is used to accomplish the gain error correction. These architectures all have the problem that it is quite difficult to correct the ADC gain error by changing the number of samples.

Primary shortcomings of the prior art technique of multiplying the conversion result by a gain error correction coefficient are that it requires too much power dissipation and too much circuit complexity, and also requires too much chip area, and too much total analog-to-digital conversion time in order to obtain the gain-error-corrected digital output value.

Thus, there is an unmet need for an ADC which corrects its ADC transfer characteristic for gain error without increasing the amount of time required for obtaining a gain-corrected digital output substantially beyond the amount of time required for a basic analog to digital conversion.

There also is an unmet need for an ADC which corrects its ADC transfer characteristic for gain error without increasing the amount of integrated circuit chip area for obtaining a gain-corrected digital output substantially beyond the amount of chip area required for a basic analog to digital conversion.

There also is an unmet need for an ADC which corrects its ADC transfer characteristic for gain error without increasing the amount of power consumption required in obtaining a gain-corrected digital output substantially beyond the amount of power consumption required for a basic analog to digital conversion.

There also is an unmet need for an ADC which corrects its ADC transfer characteristic for gain error without the high level of circuit complexity generally associated with using analog circuit techniques to correct a transfer characteristic of an ADC for gain error.

There also is an unmet need for an ADC gain error correction technique which is particularly suitable for use in a delta-sigma/cyclic ADC architecture, and is also useful in a SAR ADC architecture and in a higher-order delta-sigma ADC architecture.

SUMMARY OF THE INVENTION

It is an object of the invention to provide an ADC which corrects its ADC transfer characteristic for gain error without increasing the amount of time required for obtaining a gain-corrected digital output substantially beyond the amount of time required for a basic analog to digital conversion.

It is another object of the invention to provide an ADC which corrects its ADC transfer characteristic for gain error without increasing the amount of integrated circuit chip area for obtaining a gain-corrected digital output substantially beyond the amount of chip area required for a basic analog to digital conversion.

It is another object of the invention to provide an ADC which corrects its ADC transfer characteristic for gain error without increasing the amount of power consumption required in obtaining a gain-corrected digital output substantially beyond the amount of power consumption required for a basic analog to digital conversion.

It is another object of the invention to provide an ADC which corrects its ADC transfer characteristic for gain error while avoiding the high level of circuit complexity generally associated with using analog circuit techniques to correct a transfer characteristic of an ADC for gain error.

It is another object of the invention to provide an ADC gain error correction technique which is particularly suitable for use in a delta-sigma/cyclic ADC architecture, and is also useful in a SAR ADC architecture and in a higher-order delta-sigma ADC architecture.

Briefly described, and in accordance with one embodiment, the present invention provides correction of errors in an ADC chip including an integrator (17), a comparator (30), and a digital filter (37) by storing a gain-adjusted LSB size based on measured gain error in a memory (44). The gain-adjusted LSB size is applied to the digital filter to cause gain-adjusted LSB size values to be added to or subtracted from accumulated content of the digital filter in accordance with a first or second state, respectively, of the comparator (30) during each cycle of the ADC. The final accumulated content after all required cycles of the ADC is equal to a gain-corrected digital output signal (Dout(gain-corrected)).

In one embodiment, the invention provides an analog to digital converter (ADC) (20B) including an integrator (17) for sampling an input signal (Vin), the integrator having an input (26A,B) coupled to receive an input signal (Vin) and also having an output (27A,B). A comparator (30) has a signal input coupled to the output (27A,B) of the integrator (17), and an output (33A,B). The output of the comparator represents a present state of the comparator depending on a relationship of an output voltage on the output (27A,B) of the integrator (17) to a threshold voltage ($V_{TH}$). A digital filter (37) has an input (48A,B) coupled to the output (33A,B) of the comparator (30) and also has an output (49) for conducting a gain-corrected digital output signal (Dout(gain-corrected)) representative of the input signal (Vin). A memory (44) stores an externally determined gain-adjusted LSB size number. Circuitry (47A, B) coupled to the memory (44) applies an integral number of the gain-adjusted LSB size numbers to the input (48A,B) of the digital filter to cause the integral number of gain-adjusted LSB size numbers to be applied to content of the digital filter (37) in accordance with the present state of the comparator (30) to accumulate a value in the digital filter (37) during successive cycles of the ADC (20B) so as to generate the gain-corrected digital output signal (Dout(gain-corrected)).

In one embodiment, the comparator is a window comparator (30) having a threshold input (29) which receives a plurality of threshold voltages ($V_{TH}$'S), wherein a first state of the window comparator is a +1 state, a second state of the window comparator is a −1 state, and wherein the window comparator (30) produces a third state which is a 0 state and which results in a zero input to the digital filter (37). The integral number of gain-adjusted LSB size numbers is applied to an increment input (48A) of the digital filter (37) in accordance with the +1 state of the comparator (30) so as to cause the integral number of gain-adjusted LSB size numbers to be added to an accumulated content of the digital filter (37). The integral number of gain-adjusted LSB size numbers is applied to a decrement input (48B) of the digital filter (37) in accordance with the −1 state of the comparator (30) so as to cause the integral number of gain-adjusted LSB size numbers to be subtracted from the accumulated content of the digital filter (37).

In one embodiment, integrator (17) and the comparator (30) form a delta-sigma modulator (15). In one embodiment, the delta sigma modulator (15) is a first order delta-sigma modulator. In one embodiment, the ADC has a mixed delta-sigma/cyclic architecture.

In one embodiment, the digital filter includes an accumulator which is configured as an up-down counter the content of which is incremented or decremented in the amount of the integral number of gain-adjusted LSB size numbers.

In one embodiment, the digital filter includes an SAR (successive approximation register) results register (450), an output of which provides the gain-corrected digital output.

In a described embodiment, the integrator includes an operational amplifier (18) having a non-inverting input coupled by a first sampling capacitor (23A) to receive a first input signal (Vin⁺) and also coupled by a first integrating capacitor (24A) to an inverting output (27A) of the operational amplifier (18), the operational amplifier (18) also having an inverting input coupled by a second sampling capacitor (23B) to receive a second input signal (Vin⁻) and also coupled by a second integrating capacitor (24B) to a non-inverting output (27B) of the operational amplifier (18). The non-inverting input of the operational amplifier (18) is coupled by a third sampling capacitor (28A) to a first reference voltage (Vref⁺), a second reference voltage (Vref⁻), or is unconnected to any reference voltage in accordance with an output state of the comparator (30), and wherein the inverting input of the operational amplifier (18) is coupled by a fourth sampling capacitor (28B) to the first reference voltage (Vref⁺), the second reference voltage (Vref⁻), or is unconnected to any reference voltage in accordance with that output state of the comparator (30), to prevent overflow of the delta-sigma modulator.

The memory (44) can be a fuse link memory, a one time programmable memory, or an electrically erasable programmable memory, and can be a user-accessible register which allows a user to control the transfer characteristic of the ADC. The memory can receive the gain-adjusted LSB size number from an external test and trim system.

In a described embodiment, the memory (44) and the output (33A,B) of the window comparator (30) are coupled to an increment input (INC) of the digital filter (37) by a first ANDing circuit (47A) and are coupled to a decrement input (DEC) of the digital filter (37) by a second ANDing circuit (47B), wherein the first ANDing circuit (47A) effectuates adding of the integral number of gain-adjusted LSB size numbers from the memory (44) to the content of the digital filter (37) in accordance with a first state of the window comparator (30), and wherein the second ANDing circuit (47B) effectuates subtracting of the integral number of gain-adjusted LSB size numbers from the memory (44) to the decrement input (DEC) in accordance with a second state of the window comparator (30).

In one embodiment, the invention provides a method for operating an analog to digital converter which includes an integrator (17) having an input (26A,B) coupled to receive an input signal (Vin) and also having an output (27A,B), a comparator (30) having a signal input coupled to the output (27A, B) of the integrator (18), and an output (33A,B), the output of the comparator representing a first state or a second state, depending on a relationship of an output voltage on the output (27A,B) of the integrator (17) to a threshold voltage ($V_{TH}$), and a digital filter (37) having an input (48A,B) coupled to the output (33A,B) of the comparator (30), wherein the method includes storing an externally determined gain-adjusted LSB size number in a memory (44), applying the gain-adjusted LSB size number to the input (48A,B) of the digital filter (37) to cause an integral number of gain-adjusted LSB size numbers to be applied to content of the digital filter (37) in accordance with a present state of the comparator (30) so as to accumulate a value in the digital filter (37), and after all required cycles of the analog to digital converter, providing the accumulated value at an output of the digital filter (37) as a gain-corrected digital output signal (Dout(gain-corrected)) that represents the input signal (Vin).

In one embodiment, the method includes adding the integral number of gain-adjusted LSB size numbers from the memory (44) to the content of the digital filter (37) in accordance with a first state of the comparator (30), and subtracting the integral number of gain-adjusted LSB size numbers from the memory (44) in accordance with a second state of the comparator (30).

In one embodiment, the method includes operating the integrator (17) and the comparator (30) as a delta-sigma modulator (15) and operating the digital filter (37) as an up-down counter the content of which is incremented or decremented by the integral number of gain-adjusted LSB size numbers. In one embodiment the ADC has a mixed delta-sigma/cyclic architecture and the method includes providing an output of a SAR result register as the gain-corrected digital output.

In one embodiment, the method includes providing additional bits of resolution in an analog to digital conversion process such that no missing code appears during generation of a smaller number of bits which are utilized as the gain-corrected digital output signal.

In one embodiment, the invention provides an analog to digital converter (20B) including an integrator (17) having an input (26A,B) coupled to receive an input signal (Vin) and also having an output (27A,B), a comparator (30) having a signal input coupled to the output (27A,B) of the integrator (18), and an output (33A,B), the output representing a first state or a second state, depending on a relationship of an output voltage on the output (27A,B) of the integrator (17) to a threshold voltage ($V_{TH}$), a digital filter (37) having an input (48A,B) coupled to the output (33A,B) of the comparator (30), means (44) for storing an externally determined gain-adjusted LSB size number in a memory (44), and means (47A,47B) for applying the gain-adjusted LSB size number to content of the digital filter (37) so as to cause an integral number of gain-adjusted LSB size numbers to be applied to content of the digital filter (37) in response to a present state of the comparator (30) so as to accumulate a gain-corrected digital value (Dout(gain-corrected)) in the digital filter (37) that, the after all required cycles of the analog-to-digital converter, is a gain-corrected digital value (Dout(gain-corrected)) that represents the input signal (Vin).

DETAILED DESCRIPTION OF THE PREFERRED EMBODIMENTS

Figure 3:
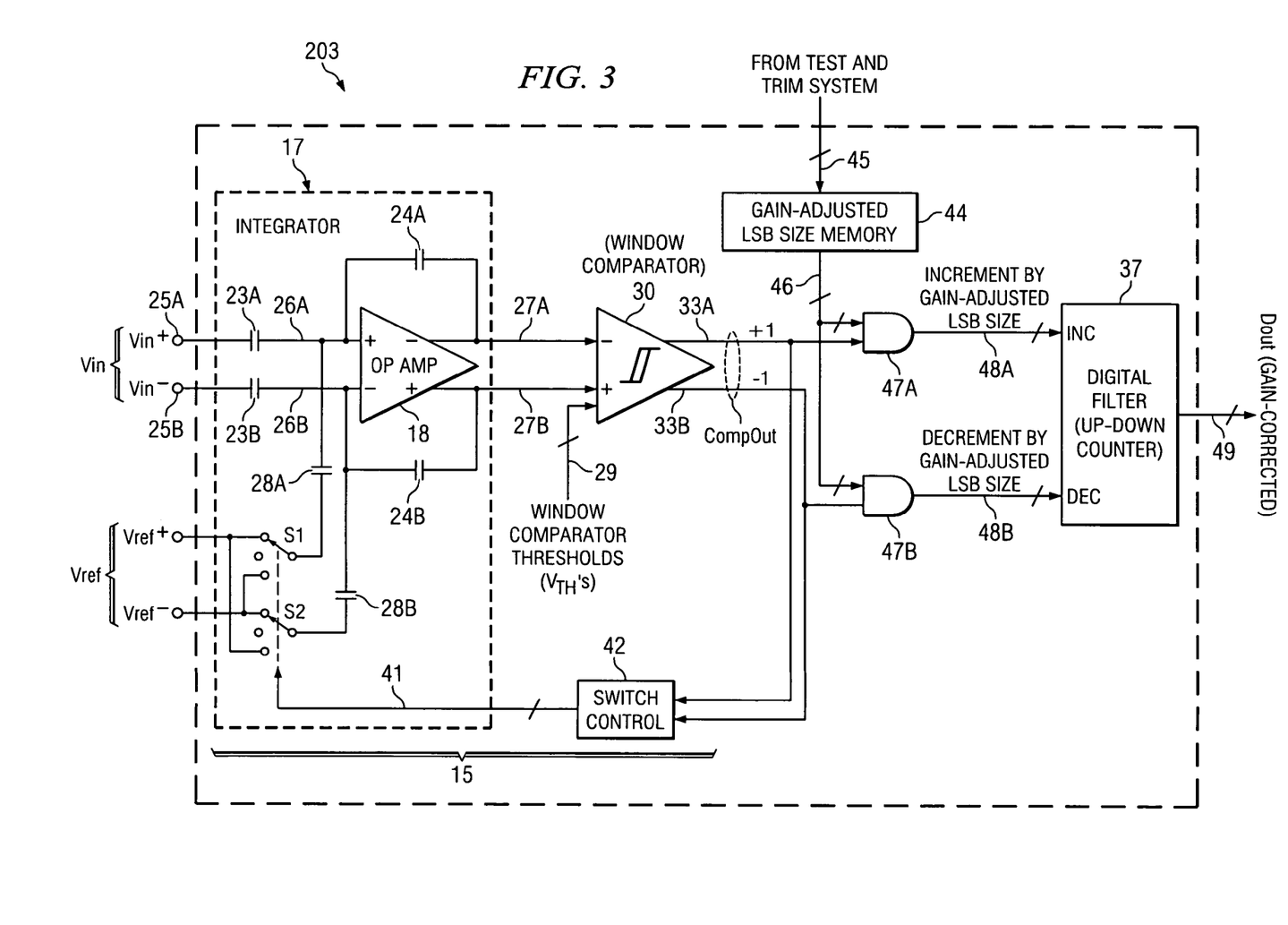
FIG. 3 is a block diagram illustrating an integrated circuit first order delta-sigma ADC utilizing a digital gain error correction technique according to the invention by, in effect, digitally modifying the value of the LSB (least significant bit) of the basic ADC conversion result.

Referring to FIG. 3, integrated circuit delta-sigma ADC chip 20B includes integrator 17, the (−) output 27A of which is coupled to the (−) input of a window comparator 30. The (+) output 27B of integrator 17 is coupled to the (+) input of window comparator 30. Window comparator 30 may be composed of two or more conventional comparators which may receive various thresholds voltages $V_{TH}$ on the conductors of window comparator threshold bus 29, respectively. (By way of definition, it should be understood that if a conventional comparator receives a differential input signal, it may be considered to have a zero threshold voltage. The term "threshold voltage" as used herein is intended to encompass a threshold voltage applied to one input of a 2-input comparator the other input of which receives an input signal voltage that is to be compared with the threshold voltage, and is intended to also encompass a zero threshold voltage of a comparator which receives a differential input signal.)

An input signal voltage Vin=$Vin^+$−$Vin^-$ is coupled between plates of input sampling capacitors 23A and 23B, the other plates of which are connected to the (+) and (−) inputs, respectively, of operational amplifier 18 of integrator 17. The (+) input conductor 26A of operational amplifier 18 is coupled by an integrating capacitor 24A to the (−) output conductor 27A of operational amplifier 18, and the (−) input conductor 26B of operational amplifier 18 is coupled by an integrating capacitor 24B to the (+) output conductor 27B of operational amplifier 18.

Just as in Prior Art FIG. 1, input conductor 26A is coupled by a reference sampling capacitor 28A to the pole of a single pole, triple throw switch circuit S1, and input conductor 26B is coupled by a reference sampling capacitor 28B to the pole of a single pole, triple throw switch circuit S2. Switch circuit S1 couples the (+) input of operational amplifier 18 through sampling capacitor 28A to $Vref^+$, $Vref^-$ or an open terminal, depending upon whether the output CompOut of window comparator 30 is +1, −1, or 0, respectively, so the reference Vref can be integrated in the correct direction if necessary, depending on the decision of window comparator 30. Similarly, switch circuit S2 couples the (−) input of operational amplifier 18 through sampling capacitor 28B to $Vref^-$, $Vref^+$, or an open terminal, depending upon whether CompOut is +1, −1, or 0, respectively, so Vref can be integrated in the correct direction if necessary.

Note that more details of the conventional delta-sigma modulator 15 appear in FIG. 3a of the assignee's subsequently mentioned pending patent application Ser. No. 11/738,566, which is incorporated herein by reference. However, those skilled in the art can readily understand the basic operation of integrator 15 as described and as shown in FIGS. 1 and 3 hereof.

By way of definition, the term "integrator" as used herein is intended is intended to encompass not only a conventional integrator such as integrator 17 shown in FIG. 3, but also an integrator in a cyclic SAR ADC, wherein the integrator only samples once per conversion. The present invention is as applicable to that kind of ADC as to a delta-sigma ADC.

Output conductor 33A of window comparator 30 is connected to an enable input of an ANDing circuit 47A which also has multiple gain error data inputs connected to a "gain-adjusted LSB size bus" 46 which is connected to the output of a "gain-adjusted LSB size memory" 44. Gain-adjusted LSB size memory 44 can be implemented by means of blowable fuses, an EEPROM (electrically erasable programmable memory), or an OTP (one time programmable) memory or the like which is loaded from a conventional external test and trim system (not shown) with a "gain-adjusted LSB size number", expressed in binary format. The output of ANDing circuit 47A is connected by conductor 48A, on which a signal INCREMENT BY GAIN-ADJUSTED LSB SIZE is applied to an increment input (INC) of digital filter 37, conventional internal circuitry (not shown) of which causes a digital number equal to the gain-adjusted LSB size to be added or "incremented" to the contents of the up-down counter or accumulator in digital filter 37. Similarly, output conductor 33B of window comparator 30 is connected to an enable input of another ANDing circuit 47B, which also has multiple inputs connected to "LSB size bus" 46. The output of ANDing circuit 47B is connected by a bus 48B, on which a signal DECREMENT BY GAIN-ADJUSTED LSB SIZE is applied to a decrement input (DEC) of digital filter 37, conventional internal circuitry (not shown) of which causes a digital number equal to the gain-adjusted LSB size to be subtracted or "decremented" from the contents of the up-down counter or accumulator in digital filter 37. After all of the required integration cycles have been performed, the output of digital filter 37 is the gain-corrected digital output signal Dout(gain-corrected).

By way of definition, the term "up-down counter" as used herein is intended to encompass accumulating circuitry in a digital filter the contents of which can be incremented by adding a non-integral LSB size number thereto or decremented by subtracting the non-integral LSB size number therefrom.

It should be understood that ANDing circuits 47A and 47B or equivalent circuitry could be included within digital filter 37 so as to provide adding or incrementing of integral numbers of LSB size numbers to or subtraction of integral numbers of LSB size numbers from the content of digital filter 37. Gain-adjusted LSB size memory 44 could be incorporated as a register which, if desired, could be considered to be within digital filter 37. Gain-adjusted LSB size memory 44 also could be implemented as a user-accessible register, which would allow the user to adjust the transfer characteristic of the ADC.

It should be appreciated that the output bus of window comparator 30 can have as many conductors as is needed to conduct the number of output states that can be generated by window comparator 30. For example, if window comparator 30 generates 3 states, a two-wire bus may be required as the output of window comparator 30. If window comparator 30 generates 5 states, a three-wire bus is required as the output of window comparator 30. (However, if an ordinary non-window type of comparator is used, then a single conductor can be used as the output of that comparator to represent the two states, "1" and "0".)

If the window comparator 30 has more than 3 states, appropriate integral multiples of the gain-adjusted LSB size are added to or subtracted from the contents of digital filter 37. For example, for a 5-level window comparator 30, its possible outputs are +2, +1, 0, 1, and −2. In this case, the gain-adjusted quantities available to be added to or subtracted from the contents of digital filter 37 will include 2×(gain-adjusted LSB size), which is implemented by shifting the quantity "gain-adjusted LSB size" by one binary bit position, 1×(gain-adjusted LSB size), 0, −1×(gain-adjusted LSB size), and −2×(gain-adjusted LSB size).

Those skilled in the art know that a window comparator can be thought of as a kind of flash ADC. For example, if a window comparator can generate 64 different states, it would be comprised of 64 ordinary comparators coupled in parallel, the 64 comparators having 64 different input threshold voltages. The output bus of a window comparator, for example a window comparator that can generate 64 different states, ordinarily is coupled to circuitry that performs an encoding function which converts the 64 comparator outputs into a 6-bit code. For example, window comparator 30 of FIG. 3, with its three output states +1, 0, and 1, is composed of 2 basic comparators having 2 separate input threshold voltages (e.g., $V_{TH}^+$ and $V_{TH}^-$), respectively, so that one basic comparator changes state when the window comparator input voltage exceeds the upper threshold voltage $V_{TH}^+$ and the other basic comparator changes state when the window comparator input voltage is less than the lower threshold voltage $V_{TH}^-$, and when the window comparator input voltage is between the upper and lower threshold voltages, neither basic comparator changes state. Two comparator output conductors 33A and 33B are required to represent the three states.

Figure 4:
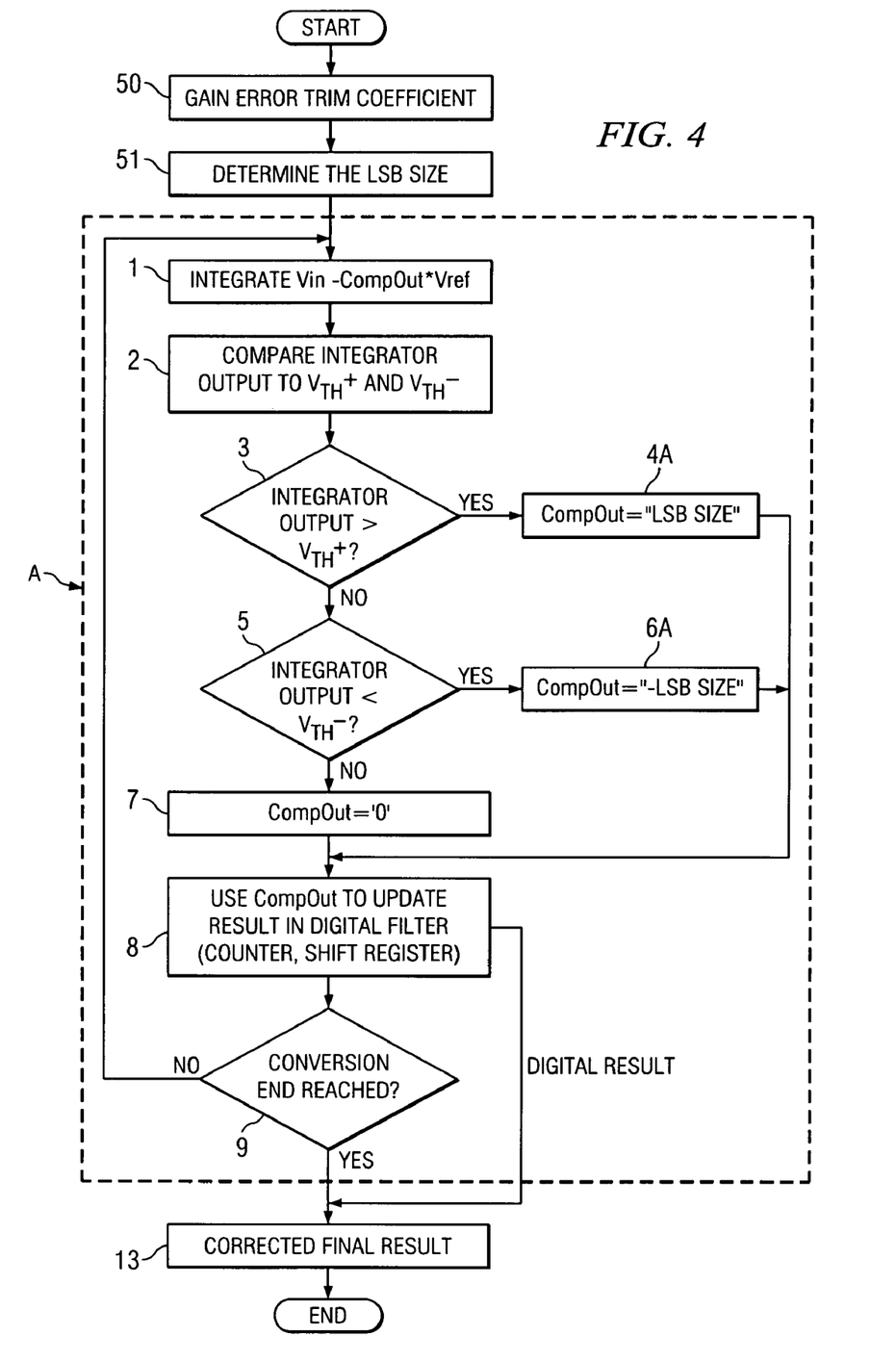
FIG. 4 is a flow chart illustrating a digital ADC gain error correction technique used in the delta-sigma ADC of FIG. 3.

FIG. 4 is a flowchart which indicates the process of obtaining the gain-adjusted LSB size and also indicates the operation of ADC 20B of FIG. 3. As indicated in block 50 of FIG. 4, the first step in the overall procedure is to determine the gain error trim coefficient.

The gain error coefficient value that needs to be multiplied by the measured digital output of ADC 20B is determined on the basis of actual measurements of Dout and the desired full scale value thereof, to determine the percentage of gain error. During final testing of ADC 20B, a known value of input voltage Vin is applied to the integrated circuit chip including ADC 20B, and the resulting analog-to-digital Dout is measured. Then the resulting error is calculated and the error is used to calculate how much the size of the LSB needs to be adjusted so that the error of the measured conversion result Dout after gain correction will be zero. The error is expressed as a percentage of the known correct value of Dout, in binary format.

As indicated in block 51 of FIG. 4, the gain-adjusted LSB size is determined after the gain error trim coefficient has been determined. The relationship between the gain error trim coefficient and the gain-adjusted LSB size can be expressed as (gain correction coefficient)×(uncorrected value of Dout) =(gain-corrected value of Dout). That value of the gain correction coefficient, which is equal to the gain-adjusted LSB size, is entered into and permanently stored in gain-adjusted LSB size memory 44, for example by blowing certain fuses or links or writing it into an OTP memory inside the integrated circuit ADC. The initial contents of gain-adjusted LSB size memory 44 can be a default value of 1.000 . . . . Then, when the amount of ADC gain error is determined, that default value is modified to a value different than 1.000 . . . , so as to generate the number GAIN-ADJUSTED LSB SIZE which is added to the accumulator or up-down counter contents if the output of window comparator 30 is +1 or is subtracted from the accumulator or up-down counter contents if the output of window comparator 30 is −1.

The part of FIG. 4 within dashed line A generally indicates how the first-order delta-sigma modulator 15 consisting of integrator 17, window comparator 30, and switch circuits S1 and S2 in FIG. 3 operate in conjunction with window comparator 30 so that during every integration cycle the input voltage Vin is integrated from the input capacitors to the holding or feedback capacitors, and this causes the value of the output of integrator 17 to go in one direction. For example, if input voltage Vin is positive, the output voltage of integrator 17 increases in response to Vin. At some point, integrator would "overflow" and stop integrating except for the fact that during every integration cycle, window comparator 30 makes a decision as to whether the output of integrator 17 is beyond a particular upper threshold voltage $V_{TH}^+$. When $V_{TH}^+$ is reached, then during the next integration cycle, integrator 17 also samples (in addition to the input voltage Vin) the reference voltage Vref in the appropriate direction, so that if the output of integrator 17 is too high, then reference voltage Vref is sampled in the negative direction (i.e., $V_{ref}^-$ is sampled) and as result the output voltage of integrator 17 decreases.

As indicated in block 1 of FIG. 4, integrator 17 integrates only the input voltage Vin during the first integration cycle of delta-sigma modulator 15, since initially window comparator output CompOut is 0. Then, as indicated in block 2, window comparator 30 determines whether the output of integrator 17 is greater than $V_{TH}^+$, less than $V_{TH}^-$, or between $V_{TH}^+$ and $V_{TH}^-$. Depending on the results of this comparison, the output of window comparator 30 is "1", "−1", or "0", respectively. (The threshold voltages $V_{TH}^+$ and $V_{TH}^-$ can be derived from Vref and the scaling of various capacitors in integrator 17 so as to provide the various desired window comparator threshold voltages $V_{TH}$ of the standard comparators of which window comparator 30 is comprised.)

In any case, window comparator output voltage CompOut is coupled to and causes the gain-adjusted LSB size to be added to or subtracted from the accumulated result in digital filter 37. If modulator 15 is a first order delta-sigma modulator as shown in FIG. 3, digital filter 37 can be implemented as an up-down counter, i.e., as an accumulator. For first-order delta-sigma modulator 15 as shown in FIG. 3, the up-down counter or accumulator of digital filter 37 is incremented by the value of the digital number GAIN-ADJUSTED LSB SIZE stored in gain-adjusted LSB size memory 44 if the output of window comparator 30 is +1, as indicated in decision block 3 and in block 4A. Similarly, the up-down counter in digital filter 37 is decremented by the value of the digital number GAIN-ADJUSTED LSB SIZE stored in gain-adjusted LSB size memory 44 if the output of window comparator 30 is −1, as indicated in decision block 5 and in block 6A, or remains unchanged if the output of window comparator 30 is "0", as indicated in block 7 of FIG. 4.

Then, as indicated in block 8, the resulting value of the window comparator output voltage CompOut is used to update the accumulated result in the up-down counter in digital filter 37 either by the amount +GAIN-ADJUSTED LSB SIZE or by the amount −GAIN-ADJUSTED LSB SIZE.

Then, as indicated in decision block 9, the process being performed in ADC 20B determines if all of the integration cycles required by ADC 20B have been performed. If this determination is negative, the integrate and compare loop including blocks 1-9 is repeated to complete the analog-to-digital conversion. On the second and each following required integration cycle after the second, integrator 17 samples not only the input voltage Vin, but also samples the reference voltage value Vref$^+$ or Vref$^-$ in accordance with window comparator output CompOut. In the case wherein CompOut is too high, i.e., the input to window comparator 30 is greater than upper threshold voltage $V_{TH}^+$, window comparator 30 makes the decision to generate a +1 output level, and during the next integration cycle integrator 17 samples the lower reference voltage value Vref$^-$ in addition to sampling input voltage Vin, and this causes the output of integrator 17 to decrease. Similarly, in the case wherein CompOut is too low, i.e., the input to window comparator 30 is less than lower threshold voltage $V_{TH}^-$, window comparator 30 makes a decision to generate a −1 output level, and during the next integration cycle integrator 17 samples the upper reference voltage value Vref$^+$ in addition to sampling input voltage Vin, and this causes the output of integrator 17 to increase. (It should be appreciated that the input voltage Vin, the reference voltage Vref, and the integrator output voltage each can be either differential or single-ended voltages, but in most practical implementations they are differential signals or are sampled as differential signals. For example, the input voltage Vin and the integrator output voltage typically are differential signals, and the reference voltage Vref is referenced to ground but is sampled as a differential signal.)

After the process of sampling Vin and Vref the required numbers of times for ADC 20B, the determination of decision block 9 is affirmative. The window comparator output CompOut then is coupled for the last time into digital filter 37, which produces the gain-error-corrected digital output Dout, and the gain-error-adjusted analog-to-digital conversion of Vin to Dout(gain-corrected) is complete.

This avoids the prior art process of digital multiplying of the basic uncorrected value of Dout by a gain error trim coefficient to produce the corrected final digital output Dout (gain-corrected).

It should be noted that only blocks 50, 51, 4A and 6B as shown in the flowchart of FIG. 4 are substantially different than in the flowchart of Prior Art FIG. 2.

As an example, assume that an input voltage Vin of 1.0 volt and a reference voltage Vref are applied to ADC 20B of FIG. 3. Assume also that the analog-to-digital conversion of the applied 1.0 volt input signal is performed, and the result is not the desired 1.0 volt digital output voltage value, but instead is a 0.9 volt digital output voltage value because of gain error of ADC 20B.

The value of the needed digital gain correction coefficient, which in this simplified example is approximately 1.1, is determined and then stored in gain-adjusted LSB size memory 44. Then the digital output conversion value of 0.9 volt produced by the integrator causes the gain-corrected digital output Dout(gain-corrected) which is accumulated in digital filter 37 and produced on bus 49 to be very close to 1 volt (actually, 0.99 volts in this simplified example).

Thus, instead of performing a digital multiplication of the basic uncorrected ADC conversion result Dout at the output of the digital filter in order to correct the ADC gain error as in Prior Art FIGS. 1 and 2, the present invention, in effect, digitally adds an integral multiple of a gain-adjusted LSB size number to the accumulated contents in the up-down counter of digital filter 37 in response to each +1 level produced by window comparator 30, and also, in effect, digitally subtracts an integral multiple of the gain-adjusted LSB size number from the accumulated contents in the up-down counter of digital filter 37 in response to each −1 level produced by window comparator 30. The gain correction function is achieved without use of a complex, slow digital multiplier as required by the prior art, and is achieved simultaneously, on a bit-to-bit basis as the analog-to-digital conversion progresses. Therefore, the substantial additional amount of time for digital multiplication by the gain correction coefficient after the basic ADC conversion operation has completely occurred as required in the prior art is avoided by the present invention.

The above mentioned technique of adjusting the size of the LSB of the digital output Dout of ADC 20B can cause "missing codes". If the LSB size is changed from 1.0 to a gain-adjusted value and that value then is repeatedly added to and/or subtracted from the accumulator or up-down counter of ADC 20B after each integration cycle, the result in the accumulator will always be a value that is equal to an integral number of gain-adjusted LSB sizes. At the end of all of the integration cycles required by ADC 20B for a single ADC conversion, there will be a need to perform a round-off of the value in the accumulator or op-down counter. Assume that the LSB size is not 1.0, but is 1.1 because it is necessary to trim the ADC gain error. Also assume that the value of Vin, and hence the value of Dout, is very close to zero wherein window comparator 30 goes to +1 only once during the entire integration process. Then the final result in the accumulator of digital filter 37 will be 1.1 because its output was incremented only once by GAIN-ADJUSTED LSB SIZE. Also assume that the part of the up-down counter content located after the decimal point is discarded, so the final value of Dout(gain-corrected) is 1.0.

Next, assume that Vin is twice as large as in the foregoing example. Then, window comparator 30 switches to a +1 twice during the entire integration process so at the end of the entire integration process the final result in the accumulator or up-down counter is 2×1.1, or 2.2. The part of this located after the decimal point is rounded off, i.e. discarded, and the final result in digital filter 37 is 2.

Next assume that Vin is 9 times greater than Vin in the first example above. Then the result in accumulator after the entire integration process is 9×1.1, i.e., 9.9. Discarding the part located after the decimal point results in a final value of value 9.

Next, assume Vin is 10 times greater than in the first foregoing example. Then the result in the accumulator of digital filter 37 is exactly 11 after all of the integration cycles required by ADC 20B have been completed. In this case there is nothing to round off, and the final result in the accumulator is taken to be 11. Thus, a missing code, namely 10, has been encountered. (Note that a missing code will occur regardless of what rounding off procedure is used.)

A solution to the above described missing code problem is to add more bits of resolution to the analog to digital conversion process such that no missing code appears during the generation of the smaller number of bits which are utilized as the output Dout. That is, adding more bits of resolution to the conversion process means that the lower amount of resolution actually desired for Dout is achieved before a missing code has a chance to occur.

The technique of the present invention is equally applicable for other methods of integration, such as higher order delta-sigma conversion or a pure SAR (successive approximation register) conversion. In some ADC architectures, additional bits of resolution can be obtained at very little expense.

In one ADC architecture referred to as a "mixed delta-sigma/cyclic architecture", conventional integration is utilized to generate some of the output bits, after which a SAR mode of operation is utilized and a residue on the output of the integrator is multiplied by a factor of 2 during each cycle. The binary content of the SAR filter is also shifted by one bit. (By way of definition, the term "cycles" can refer to sub-cycles of the SAR process.)

Details of such a "mixed delta-sigma/cyclic ADC architecture", including additional details of conventional first order delta-sigma modulator 15 shown in FIGS. 1 and 3 herein, are shown in FIG. 3a of the assignee's pending patent application Ser. No. 11/738,566 entitled "Hybrid Delta-Sigma/SAR Analog to Digital Converter and Methods for Using Such", filed Apr. 23, 2007 by Jerry Doorenbos, Marco Gardner and Dimitar Trifonov, and incorporated herein by reference.

A cyclic SAR ADC works as follows. First, the integrator samples the ADC input voltage. Then the ADC performs a number of SAR successive approximation analog to digital conversion cycles. In the case of a cyclic SAR such as one included as part of the mixed delta-sigma/cyclic ADC architecture in the above mentioned patent application Ser. No. 11/738,566, the residue on the output of the integrator 310 shown in FIG. 3a after a predetermined number of integration cycles therein is multiplied by 2 each cycle. If the comparator output is equal to +1, then together with the multiplication by 2, a negative reference voltage Vref is sampled. If the comparator output is equal to −1, then together with the multiplication by 2, a positive reference voltage Vref is sampled. If the comparator output is equal to 0, then only the multiplication by 2 is performed.

The procedure performed during each SAR cycle, can be summarized by the following algorithm:

If (Vresidue>+Vthreshold) Then
   Vout=2*(Vresidue−Vref)
Else If (Vresidue<−Vthreshold) Then
   Vout=2*(Vresidue+Vref)
Else
   Vout=2*(Vresidue)
End If The foregoing algorithm can be modified for various SAR ADC implementations.

Next, an example is provided to show how the result is accumulated in the SAR result register 450 in FIG. 3a of Ser. No. 11/738,566, (which can be a digital filter that in this particular case is more like a shift register). Assume that the ADC is a 5 bit SAR ADC and that in accordance with 5 corresponding SAR cycles, comparator 414 generates a sequence of 5 decisions or states which are +1, 0, +1, −1, +1. The conversion results can be produced in two different ways that yield the same result.

The first way, which can be referred to as a "shift register approach", is as follows. Since the comparator decision during the first SAR cycle is +1, so the initial value (00000) plus the comparator output +1 is loaded into the shift register. The result is 00000+1=00001.

For the second cycle, the comparator decision is 0, so the present contents of the shift register are shifted one position to the left and the 00001 becomes 00010 and is added to the comparator output 0, producing the result 00010+0=00010.

For the third cycle, the comparator decision is +1, so the present contents of the shift register are shifted one position to the left and the 00010 becomes 00100 and is added to the comparator output +1, producing the result 00100+1=00101.

For the fourth cycle, the comparator decision is −1, so the present contents of the shift register are shifted one position to the left and the 00101 becomes 01010 and is added to the comparator output −1, producing the result 01010−1=01001.

For the fifth cycle, the comparator decision is +1, so the present contents of the shift register is shifted one position left and of the 01001 becomes 10010 and is added to the comparator output +1, producing the result 10010+1=10011. Thus, the final conversion result is 10011.

The second way, which is referred to as the "digital filter approach", is as follows. Since the comparator decision during the first SAR cycle is +1, the comparator output is scaled by the integer value 16, and the scaled comparator output becomes +10000. The initial value 00000 plus the scaled comparator output +10000 is loaded into the result register 450, producing the result 00000+10000=10000.

For the second SAR cycle, the comparator decision is 0, so the comparator output is scaled by the integer value 8. Then the previous value 10000 in the result register plus the scaled comparator output 0 is loaded into the result register, producing the result 10000+0=10000.

For the third cycle, the comparator decision is +1, so the comparator output is scaled by the integer value 4, and the scaled comparator output becomes +100. Then the previous value 10000 in the result register plus the scaled comparator output +100 is loaded into the result register, producing the result 10000+100=10100.

For the fourth cycle, the comparator decision is −1, so the comparator output is scaled by the integer value 2, and the scaled comparator output becomes −10. Then the previous value 10100 in the result register plus the scaled comparator output (−10) is loaded into the result register, producing the result 10100−10=10010.

For the fifth cycle, the comparator decision is +1, so the comparator output is scaled by the integer value 1, and scaled comparator output remains +1. Then the previous value 10010 plus the scaled comparator output +1 is loaded into the result register, producing the result 10010+1=10011. Thus, the final conversion result is 10011.

Next, an example be provided to show how the basic technique of the present invention can be applied to the mixed delta-sigma/cyclic architecture shown in above mentioned pending patent application Ser. No. 11/738,566. In the present invention, instead of sending the comparator values +1, 0, −1 to the result register 450 as described above, the properly scaled "LSB size number" is sent to the result register. Assume that the ideal conversion result from the ADC for the same input voltage as in the previous example is 10100, but because of ADC gain error the actual measured result is 10011. Then the needed LSB size number is calculated to be 1.0001, which is a binary number representing a 6.25% gain error correction. If this gain-corrected "LSB size number" is applied to the above mentioned algorithm above with the same sequence of decisions from the comparator 414, the result for each of the previously described examples will be as follows.

To apply the present invention to the previously described the "shift register approach", for the first cycle, of the comparator decision is +1, the initial value 00000.0000 in the SAR result register 450 plus the "LSB size number" scaled by the comparator output +1 is loaded into the shift register, producing the result 00000.0000+1.0001=00001.0001.

For the second cycle, the comparator decision is 0 so for present contents of the shift register is shifted one position to the left and the 00001.0001 becomes 00010.0010 and is added to the "LSB size number" scaled by the comparator output 0, producing the result 00010.0010+0=00010.0010.

For the third cycle, the comparator decision is +1, so the present contents of the shift register are shifted one position to the left and the 00010.0010 becomes 00100.0100 and is added to the "LSB size number" scaled by the comparator output +1, producing a result 00100.0100+1.0001=00101.0101.

For the fourth cycle, the comparator decision is −1, so the present contents of the shift register are shifted one position to the left and the 00101.0101 becomes 01010.1010 and is added to the "LSB size number" scaled by the comparator output −1, producing the result 01010.1010−1.0001=01001.1001.

For the fifth cycle, the comparator decision is +1, so the present contents of the contents of the shift register are shifted one position to the left and the 01001.1001 becomes 10011.0010 and is added to the "LSB size number" scaled by the comparator output (+1), producing the result 10011.0010+1.0001=10100.0011.

After rounding off (discarding) the numbers after the decimal point, the final gain-adjusted ADC conversion result is 10100.

To apply the present invention to the previously described "digital filter approach", for the first SAR cycle, the comparator decision is +1, so the "LSB size number" is scaled by the comparator output and by the integer value 16 so the scaled value becomes +10001.0000. The initial value 00000.0000 plus the scaled comparator output +10001.0000 is loaded into the digital filter, producing the result 00000.0000+10001.0000=10001.0000.

For the second SAR cycle, the comparator decision is 0, so the "LSB size number" is scaled by the comparator output and by the integer value 8 so the scaled value becomes 0.0000 since the comparator output states is 0. Then the previous value 10001.0000 plus the scaled "LSB size number" 0.0000 is loaded into the digital filter, producing the result 10001.0000+0=10001.0000.

For the third SAR cycle, the comparator decision is +1, so the "LSB size number" is scaled by the comparator output and by the integer value 4 so the scaled value becomes +100.0100. Then the previous value 10001.0000 plus the scaled "LSB size number"+100.0100 is loaded into the digital filter, producing the result 10001.0000+100.0100=10101.0100.

For the fourth cycle, the comparator decision is −1, so the "LSB size number" is scaled by the comparator output and by the integer value 2 so the scaled value becomes −10.0010. Then the previous value 10101.0100 plus the scaled "LSB size number"−10.0010 is loaded into the digital filter, producing the result 10101.0100−10.0010=10011.0010.

For the fifth cycle, the comparator decision is +1, so the "LSB size number" is scaled by the comparator output and by the integer value 1 so the scaled value remains +1.0001. Then the previous value (10011.0010) plus the scaled "LSB size number"+1.0001 is loaded into the digital filter, producing the result 10011.0010+1.0001=10100.0011.

After rounding off or discarding the numbers after the decimal point, the final gain-corrected ADC conversion result is 10100.

There are various implementations of SAR ADC but all of them accumulate the desired digital result in the ways exemplified above, and all of them can be corrected for gain error by means of the above described algorithm.

For application to the architecture described in above mentioned Ser. No. 11/738,566, the present invention works in the same way. First, in the integration mode the "LSB size number" is applied during every integration cycle to the digital filter contents as scaled by the comparator output (+1, 0 or −1). No shifting to the left is performed. When the mixed integrating/SAR circuit switches from integrating mode to SAR mode, the accumulated number in the register (i.e., the DS Result Counter 460 in FIG. 3a of Ser. No. 11/738,566) is taken as "initial value" and the gain-corrected conversion proceeds in the above described SAR mode.

As an example, assume that there are 8 integration cycles followed by 5 SAR cycles. Also assume that during the integration cycles the comparator switched states six times to +1, then once to 0, and then to −1. Then the integration result will be 6−1=5 (i.e., binary 101). In SAR mode, the initial value of the result register will be 00000101 using the "shift register" algorithm or 10100000 using the "digital filter" approach.

According to the present invention, and with the same "LSB size number"+1.0001 after the integration mode operation and before the SAR mode operation, the initial value of the result register will be 00000101.0101 using the above described "shift register" algorithm or 10101010.0000 using the "digital filter" approach. As in the "shift register" approach, the initial value is shifted one position left every SAR cycle so the final effect of the integration cycles (which determine the MSBs of the result) on the result is the same.

Fundamentally, the invention provides an LSB size number and then scales it by an integer and then adds or subtracts the scaled amount to the contents of the digital filter, according to the state of the comparator. For example, in the case of using the invention in a successive approximation ADC, the LSB size number might be successively scaled by numbers such as 16,384, 8192, 4096, 2048, 1024, 512, 256 etc., before the LSB size number is added to or subtracted from the content of the SAR register according to the status of the comparator.

The invention thus provides a method of correction of the gain error of an ADC by changing the value of its LSB which is added to or subtracted from the digital filter contents in response to the output states generated by the window comparator. For example, if the nominal value of the LSB of ADC 20B in FIG. 3 is "1", its value may be adjusted by an amount in the range from "0.111110000000" to "1.000001111111". With 8 bits available to trim the value of the LSB, this provides a +/−3% trim range and 0.024% trim resolution.

An advantage of the above described embodiment of the invention is that it does not require an additional digital multiplier as required by the prior art, and therefore does not require additional time and additional integrated circuit die area for the multiplication required using the prior art techniques, and therefore also reduces the amount of power consumption required for a DC gain correction. The technique of the present invention can be easily implemented as a so-called final test trimming operation which takes into account all shifts of the ADC performance during the usual wafer back grinding process and integrated circuit packaging operations. The only penalty is the increased size of the accumulation register of the digital filter. The described embodiments of the invention also provide a convenient way of dealing with missing output codes which occur if the LSB size is trimmed to a value greater than 1, by simply increasing the resolution. This is especially easily accomplished in a mixed delta sigma/cyclic architecture and in a SAR ADC architecture, because each additional bit of resolution requires only one additional integration cycle.

Other advantages of the above described embodiment of the present invention and adjusting LSB size of the ADC to trim gain error include the fact that it is in an entirely digital correction and does not require any additional analog circuitry. It is capable of providing any desirable trim range and trim resolution, does not substantially increase the overall gain-adjusted ADC conversion time, does not require additional mathematical operations, and requires less integrated circuit chip area and less power consumption than the prior art techniques for correcting gain error of an ADC. The technique of the present invention also improves DNL (differential non-linearity) and INL (integral non-linearity) of the ADC by adding more bits of resolution to the conversion result, and can be applied to various ADC architectures, such as SAR ADCs and high order delta sigma ADCs.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention applies not only to first order delta-sigma ADC architecture as described above, but also to a mixed delta-sigma/cyclic architecture, or to a complete SAR ADC, or a higher order delta-sigma ADC. It applies to all ADC architectures that require a low number of integration cycles and to accomplish an analog to digital conversion. It should be appreciated that if the modulator 15 is a SAR ADC, then the digital filter 37 is more like a shift register than an up-down counter. If modulator 15 is a higher order delta-sigma modulator, then the digital filter typically is a much more complex digital filter that depends on the architecture of the ADC.

What is claimed is:

1. An analog to digital converter (ADC) comprising:
(a) an integrator for sampling an input signal, having an input coupled to receive an input signal and also having an output;
(b) a comparator having a signal input coupled to the output of the integrator, and an output representing a present state of the comparator depending on a relationship of an output voltage on the output of the integrator to a threshold voltage;
(c) a digital filter having an input coupled to the output of the comparator and also having an output for conducting a gain-corrected digital output signal representative of the input signal;
(d) a memory for storing an externally determined gain-adjusted LSB size number; and
(e) circuitry coupled to the memory for applying an integral number of the gain-adjusted LSB size numbers to the input of the digital filter to cause the integral number of gain-adjusted LSB size numbers to be applied to content of the digital filter in accordance with the present state of the comparator to accumulate a value in the digital filter during successive cycles of the ADC so as to generate the gain-corrected digital output signal.

2. The ADC of claim 1 wherein the comparator is a window comparator having a threshold input which receives a plurality of threshold voltages, wherein the window comparator produces a first state which is a +1 state, a second state which is a −1 state, and wherein the window comparator produces a third state which is a 0 state and which results in a zero input to the digital filter, wherein the integral number of gain-adjusted LSB size numbers is applied to an increment input of the digital filter in accordance with the +1 state of the comparator so as to cause the integral number of gain-adjusted LSB size numbers to be added to the accumulated content of the digital filter, and wherein the integral number of gain-adjusted LSB size numbers is applied to a decrement input of the digital filter in accordance with the −1 state of the comparator so as to cause the integral number of gain-adjusted LSB size numbers to be subtracted from the accumulated content of the digital filter.

3. The ADC of claim 1 wherein the integrator and the comparator form a delta-sigma modulator.

4. The ADC of claim 3 wherein the delta sigma modulator is a first order delta-sigma modulator.

5. The ADC of claim 4 wherein the digital filter is configured as an accumulator.

6. The ADC of claim 5 wherein the accumulator is configured as an up-down counter the content of which is incremented or decremented in the amount of the integral number of gain-adjusted LSB size numbers.

7. The ADC of claim 1, wherein the ADC has a mixed delta-sigma/cyclic architecture.

8. The ADC of claim 1 wherein the digital filter includes an SAR (successive approximation register) result register, an output of which provides the gain-corrected digital output.

9. The ADC of claim 1 wherein the integrator includes an operational amplifier having a non-inverting input coupled by a first sampling capacitor to receive a first input signal and also coupled by a first integrating capacitor to an inverting output of the operational amplifier, the operational amplifier also having an inverting input coupled by a second sampling capacitor to receive a second input signal and also coupled by a second integrating capacitor to a non-inverting output of the operational amplifier.

10. The ADC of claim 9 wherein the non-inverting input of the operational amplifier is coupled by a third sampling capacitor to a first reference voltage, a second reference voltage, or is unconnected to any reference voltage in accordance with an output state of the comparator, and wherein the inverting input of the operational amplifier is coupled by a fourth sampling capacitor to the first reference voltage, the second reference voltage, or is unconnected to any reference voltage in accordance with that output state of the comparator, to prevent overflow of a delta-sigma modulator.

11. The ADC of claim 10 wherein the input signal is equal to the first input signal minus the second input signal.

12. The ADC of claim 1 wherein the integral number is 1.

13. The ADC of claim 1 wherein the memory is one of the group including a fuse link memory, a one time programmable memory, and an electrically erasable programmable memory.

14. The ADC of claim 1 wherein the memory includes means for receiving the gain-adjusted LSB size number from an external test and trim system.

15. The ADC of claim 1 wherein the memory and the output of the comparator are coupled to an increment input of the digital filter by a first ANDing circuit and are coupled to a decrement input of the digital filter by a second ANDing circuit, wherein the first ANDing circuit effectuates adding of the integral number of gain-adjusted LSB size numbers from the memory to the content of the digital filter in accordance with a first state of the comparator, and wherein the second ANDing circuit effectuates subtracting of the integral number of gain-adjusted LSB size numbers from the memory to the decrement input in accordance with a second state of the comparator.

16. A method for operating an analog to digital converter which includes
  1. an integrator having an input coupled to receive an input signal and also having an output,
  2. a comparator having a signal input coupled to the output of the integrator, and an output, the output of the comparator representing a first state or a second state, depending on a relationship of an output voltage on the output of the integrator to a threshold voltage, and
  3. a digital filter having an input coupled to the output of the comparator, the method comprising:
  (a) storing an externally determined gain-adjusted LSB size number in a memory;
  (b) applying the gain-adjusted LSB size number to the input of the digital filter to cause an integral number of gain-adjusted LSB size numbers to be applied to content of the digital filter in accordance with a present state of the comparator so as to accumulate a value in the digital filter; and
  (c) after all required cycles of the analog to digital converter, providing the accumulated value at an output of the digital filter as a gain-corrected digital output signal that represents the input signal.

17. The method of claim 16 including adding the integral number of gain-adjusted LSB size numbers from the memory to the content of the digital filter in accordance with a first state of the comparator, and subtracting the integral number of gain-adjusted LSB size numbers from the memory in accordance with a second state of the comparator.

18. The method of claim 16 including operating the integrator and the comparator as a delta-sigma modulator and operating the digital filter as an up-down counter the content of which is incremented or decremented by the integral number of gain-adjusted LSB size numbers.

19. The method of claim 16 wherein the ADC has a mixed delta-sigma/cyclic architecture and the method includes providing an output of a SAR result register as the gain-corrected digital output.

20. The method of claim 16 including providing additional bits of resolution in an analog to digital conversion process such that no missing code appears during generation of a smaller number of bits which are utilized as the gain-corrected digital output signal.

21. An analog to digital converter comprising:
  (a) an integrator having an input coupled to receive an input signal and also having an output;
  (b) a comparator having a signal input coupled to the output of the integrator, and an output, the output representing a first state or a second state, depending on a relationship of an output voltage on the output of the integrator to a threshold voltage;
  (c) a digital filter having an input coupled to the output of the comparator;
  (d) means for storing an externally determined gain-adjusted LSB size number in a memory; and
  (e) means for applying the gain-adjusted LSB size number to content of the digital filter so as to cause an integral number of gain-adjusted LSB size numbers to be applied to content of the digital filter in response to a present state of the comparator so as to accumulate a gain-corrected digital value in the digital filter that, the after all required cycles of the analog-to-digital converter, is a gain-corrected digital value that represents the input signal.

* * * * *